United States Patent
Li

(10) Patent No.: US 7,215,153 B2
(45) Date of Patent: *May 8, 2007

(54) FULLY DIFFERENTIAL INPUT BUFFER WITH WIDE SIGNAL SWING RANGE

(75) Inventor: Hung-Sung Li, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/266,207

(22) Filed: Nov. 4, 2005

(65) Prior Publication Data

US 2006/0055426 A1 Mar. 16, 2006

Related U.S. Application Data

(63) Continuation of application No. 10/761,276, filed on Jan. 22, 2004, now Pat. No. 6,977,526.

(51) Int. Cl.
*H03K 19/094* (2006.01)
*H03F 3/45* (2006.01)

(52) U.S. Cl. .................................. 326/83; 330/253

(58) Field of Classification Search ............ 326/21–24, 326/82, 83, 112, 119, 122; 330/253, 261
See application file for complete search history.

(56) References Cited

U.S. PATENT DOCUMENTS

| | | |
|---|---|---|
| 6,756,847 B2 | 6/2004 | Blecker et al. |
| 6,781,460 B2 * | 8/2004 | Crain et al. ................. 330/253 |
| 2005/0110569 A1 | 5/2005 | Bhattacharjee et al. |

* cited by examiner

*Primary Examiner*—Daniel Chang
(74) *Attorney, Agent, or Firm*—Sterne, Kessler, Goldstein & Fox, P.L.L.C.

(57) ABSTRACT

An input buffer for use in a differential operational amplifier is disclosed that regulates current through a main input differential pair while preventing output distortion and allowing high linearity. The input buffer includes a main input transistor pair that receives a voltage input, a tail current source, and a squeezable tail current source circuit including a single-ended self-biased folded feedback loop. These are configured such that current through the main input transistor pair is maintained as the voltage input varies. The folded feedback loop includes a folding transistor and a biasing current source that biases the folding transistor. The squeezable tail current source circuit also includes a replica transistor pair, a bias transistor, and a tail transistor pair. The biasing current source and folding transistor isolate the bias transistor and tail transistor pair from a drain voltage of the replica transistor pair, preventing output distortion and allowing high linearity.

20 Claims, 6 Drawing Sheets

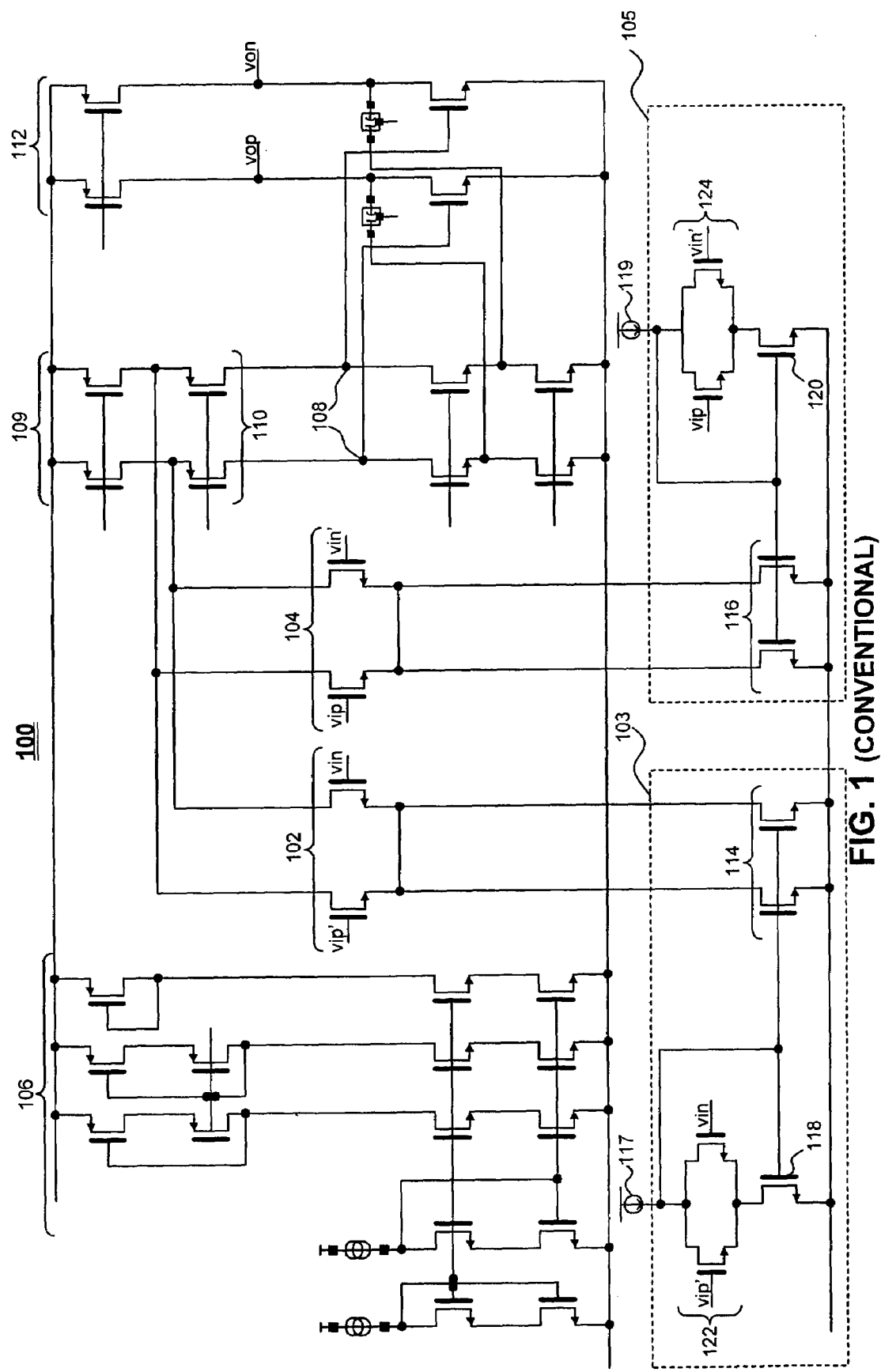
FIG. 1 (CONVENTIONAL)

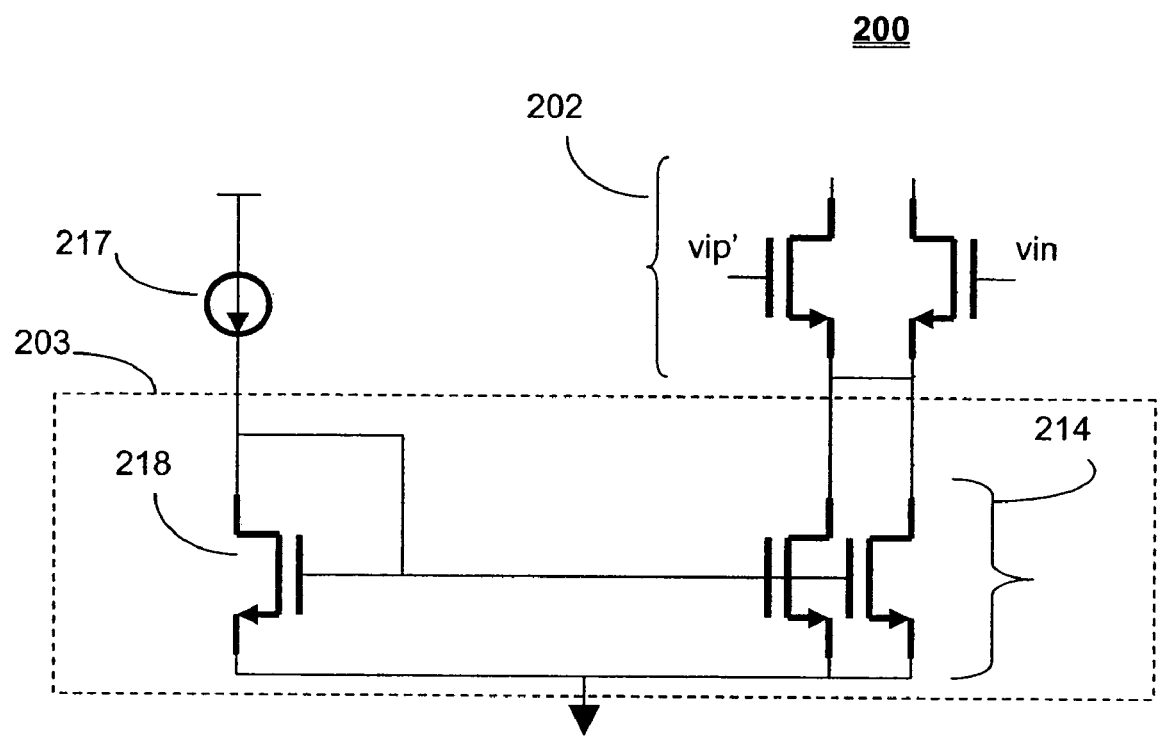
**FIG. 2
(CONVENTIONAL)**

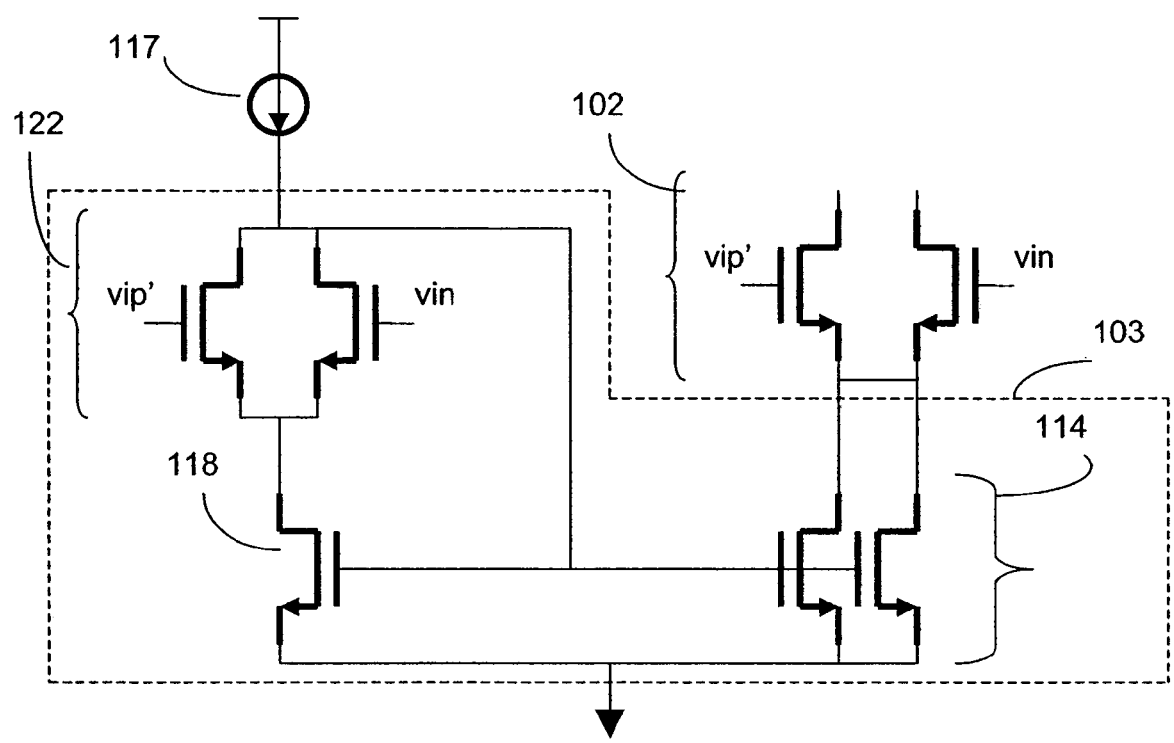
FIG. 3
(CONVENTIONAL)

FULLY DIFFERENTIAL INPUT BUFFER WITH WIDE SIGNAL SWING RANGE

CROSS-REFERENCE TO RELATED APPLICATIONS

This application is a continuation of U.S. patent application Ser. No. 10/761,276, filed Jan. 22, 2004, now U.S. Pat. No. 6,977,526, which is incorporated by reference herein in its entirety.

BACKGROUND OF THE INVENTION

1. Field of the Invention

This invention relates generally to processors with an analog-to-digital conversion interface and a buffer to drive the input. More particularly, this invention relates to differential input buffers, such as used in programmable gain amplifiers of Asymmetric Digital Subscriber Line (ADSL) receivers.

2. Related Art

The Asymmetric Digital Subscriber Line (ADSL) is one of the new technologies used for high-speed Internet access. Data rates up to 9 Mb/s are currently available in the standard ADSL offering. An ADSL transmission system is specified in a frequency-division multiplexed scheme, with the downstream (i.e., central office to customer) utilizing a frequency range of approximately 160 kHz to 1.104 MHz and upstream (i.e., customer to central office) utilizing a frequency range of approximately 30 kHz to 138 kHz. In each frequency domain, the frequencies are divided into data bins with 4 kHz frequency spacing. For a discrete multi-tone system such as an ADSL system, the data rate is directly proportional to the signal-to-noise-distortion ratio (SNDR) available at the receive bins. The data rate increases with an increase in SNDR. High SNDR is achieved with large signal and low harmonic distortion and low noise.

A single ADSL chip integrates many digital circuits with sensitive front-end analog circuitry. An ADSL receiver front-end consists of a programmable gain amplifier and a unit-gain input buffer for backend analog-to-digital conversion (ADC). Because the system is typically manufactured in a digital process, the supply voltage is scaled with the shrinking transistor geometry. For example, a 0.251 μm process uses a supply voltage of 2.5 volts while a 0.13 μm process can tolerate a supply voltage of only 1.2 volts. When a supply voltage is reduced, the signal swing that the unit-gain input buffer can handle is limited due to reduced headroom. This limitation causes a reduction in SNDR.

It is therefore crucial to maximize the range of the signal swing that the receiver front-end circuit can process while maintaining low distortion performance (i.e., high linearity). Typically this is done with amplifiers that have one or more squeezable tail current sources. Linearity is important because harmonic distortion results in spillover from data bin to data bin that may corrupt the data spectrum. An ADSL system requires a high linearity performance in the neighborhood of 100 dB. To accomplish this, the squeezable tail current source must also be extremely linear, which requires a slightly different squeezable tail current source design.

What is needed is a fully differential input buffer with a wide signal swing range that allows for high linearity performance independent of the input voltage.

SUMMARY OF THE INVENTION

A squeezable tail current source for use in a differential operational amplifier is disclosed that regulates the current through a main input differential pair while preventing output distortion and allowing high linearity. According to an embodiment of the present invention, the squeezable tail current source includes a first transistor pair that replicates a main input transistor pair, wherein both the first transistor pair and the main input transistor pair receive a common voltage input at their respective gates. The squeezable tail current source also includes a second transistor pair, a bias transistor, a first current source, a folding transistor, and a second current source that biases the folding transistor. These components are configured such that current through the main input transistor pair is maintained as the voltage input varies. Current through the second transistor pair and the bias transistor is squeezed as the voltage input is decreased, thereby increasing a gate voltage of the bias transistor, and thereby causing current through both the first transistor pair and the main input transistor pair to remain nearly constant. In addition, the second current source and the folding transistor isolate the bias transistor and the second transistor pair from a drain voltage of the first transistor pair, thereby causing the first transistor pair and the main input transistor pair to have a common drain bias, which prevents output distortion and allows high linearity to be achieved.

In one embodiment of the present invention, the first transistor pair, the second transistor pair, and the bias transistor are NMOS transistors, and the folding transistor is a PMOS transistor. In another embodiment of the present invention, the first transistor pair, the second transistor pair, and the bias transistor are PMOS transistors, and the folding transistor is an NMOS transistor.

A differential input buffer that includes two main input differential pairs, and therefore two squeezable tail current sources is also disclosed, according to an embodiment of the present invention. The differential input buffer includes first and second main input transistor pairs. The differential input buffer further includes a first replica transistor pair that replicates the first main input transistor pair, wherein both the first replica transistor pair and first main input transistor pair receive a first common voltage input at their respective gates. The differential input buffer further includes a second replica transistor pair that replicates the second main input transistor pair, wherein both the second replica transistor pair and second main input transistor pair receive a second common voltage input at their respective gates. The differential input buffer further includes first and second tail transistor pairs, first and second bias transistors, first and second current sources, and first and second folding transistors. The differential input buffer further includes a first biasing current source that biases the first folding transistor, and a second biasing current source that biases the second folding transistor.

In this differential input buffer embodiment, the first main input transistor pair, the first replica transistor pair, the first tail transistor pair, the first bias transistor, and the first current source are configured such that current through the first main input transistor pair is maintained as the first common voltage input to the first main input pair varies. Similarly, the second main input transistor pair, the second replica transistor pair, the second tail transistor pair, the second bias transistor, and the second current source are configured such that current through the second main input transistor pair is maintained as the voltage input to the second main input pair varies. In embodiments of the present invention, current through a tail transistor pair and its corresponding bias transistor is squeezed as the voltage input to the corresponding main input pair is decreased. This increases a gate voltage of the bias transistor and causes current through both the corresponding replica transistor pair and main transistor pair to remain nearly constant.

In an embodiment of the present invention, the first biasing current source and the first folding transistor isolate the first bias transistor and the first tail transistor pair from a drain voltage of the first replica transistor pair, thereby causing the first replica transistor pair and the first main input transistor pair to have a common drain bias. Similarly, the second biasing current source and the second folding transistor isolate the second bias transistor and the second tail transistor pair from a drain voltage of the second replica transistor pair, thereby causing the second replica transistor pair and the second main input transistor pair to have a common drain bias. When the replica transistor pair and corresponding main input transistor pair have a common drain bias, output distortion is prevented and high linearity is achieved.

In one embodiment of the present invention, the first main input transistor pair, the second main input transistor pair, the first replica transistor pair, the second replica transistor pair, the first tail transistor pair, the second tail transistor pair, the first bias transistor, and the second bias transistor are NMOS transistors. In this embodiment, the first folding transistor and the second folding transistor are PMOS transistors. In another embodiment of the present invention, the first main input transistor pair, the second main input transistor pair, the first replica transistor pair, the second replica transistor pair, the first tail transistor pair, the second tail transistor pair, the first bias transistor, and the second bias transistor are PMOS transistors. In this embodiment, the first folding transistor and the second folding transistor are NMOS transistors.

In an embodiment of the present invention, the differential input buffer further includes first and second stages. The first stage includes an input coupled to drains of the first and second main input transistor pairs and also includes an output. The second stage includes an input coupled to the first stage output and also includes an output coupled to an output of the differential input buffer.

A method of regulating current through a main input differential pair of a differential amplifier circuit, while maintaining high linearity, is also disclosed. According to an embodiment of the present invention, the method includes providing a voltage input to the main input differential pair. The method further includes mirroring a tail current to that of the current through the main input differential pair by using a squeezable tail current source that includes a current source, a first transistor pair, a bias transistor, and a second transistor pair. The method further includes isolating the bias transistor and the first transistor pair from a drain voltage of the second transistor pair, thereby causing the second transistor pair and the main input transistor pair to have a common drain bias. The method further includes squeezing the tail current as the voltage input is decreased, thereby increasing a gate voltage of the bias transistor and allowing current through the main input differential pair to remain nearly constant.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

FIG. 1 illustrates a conventional differential operational amplifier with a squeezable tail current source.

FIG. 2 illustrates a portion of an operational amplifier, highlighting an exemplary conventional mirrored tail current source.

FIG. 3 illustrates a portion of the operational amplifier of FIG. 1, highlighting an exemplary conventional squeezable tail current source.

Figure 4:
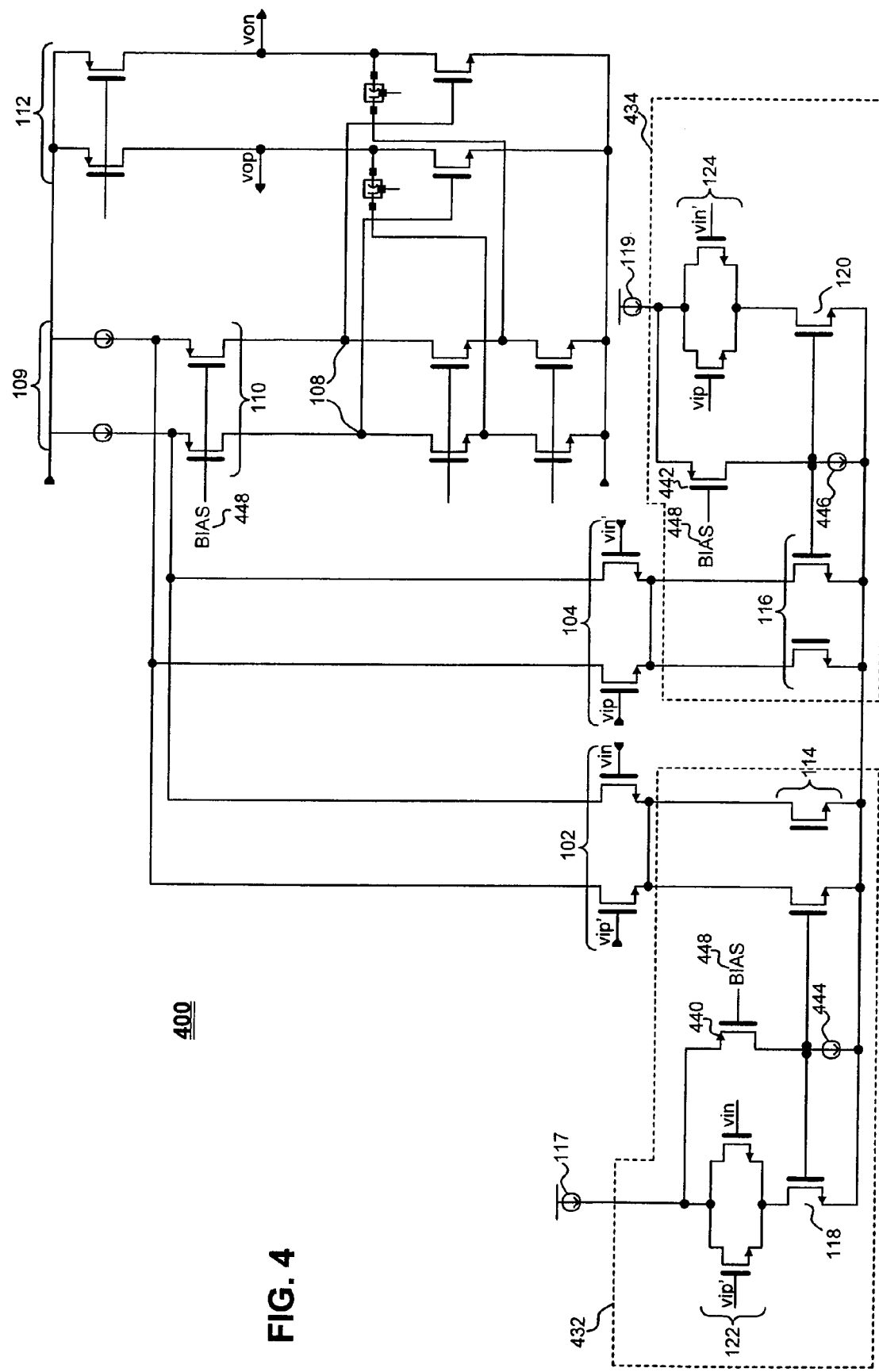
FIG. 4 illustrates a differential operational amplifier including a tail current source that provides high linearity, according to an embodiment of the present invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

FIG. 1 illustrates a conventional four-input differential operational amplifier with squeezable tail current. Differential operational amplifier 100 has four input terminals represented by transistors forming main input differential pairs 102 and 104. Differential pair 102 has inputs vip' and vin. Differential pair 104 has inpus vip and vin'. The transistor banks 106 are bias transistors. An output 108 of a first stage 109 of the amplifier is located at the drains of transistor pair 110, which feed into an input of a second stage 112 of the amplifier. Ports vop and von are outputs of amplifier 100. Connecting vop to vin' and von to vip' creates a unit-gain input buffer.

The amplifier circuit 100 includes squeezable tail current sources to handle a large input swing. The portions of differential amplifier 100 represented by box 103 (encompassing transistors 114, 118, and 122) and by box 105 (encompassing transistors 116, 120, and 124) are referred to herein as squeezable tail current sources 103, 105. As can be seen in FIG. 1, main input pair 102 is coupled to squeezable tail current source 103 and main input pair 104 is coupled to squeezable tail current source 105. The squeezable tail current sources 103, 105 presented in FIG. 1 are described in detail below. Although differential amplifier 100 includes more than one squeezable tail current source, only one squeezable tail current source (103) is described for simplicity of the description. Both squeezable tail current sources 103, 105 of differential amplifier 100 operate in a similar manner, as will be understood by those skilled in the art.

FIG. 2 illustrates a conventional version 200 of a mirrored tail current source that is not shown in FIG. 1, but discussed here for explanatory purposes. The squeezable tail current source 203 operates as follows. To mirror current bias, a current source 217 and a bias transistor 218 are needed, and the current is mirrored to transistor pair 214. As the input signal (vip', vin) decreases, the tail current through transistor pair 214 is squeezed. The drain voltage (Vds) of transistor pair 214 decreases and the current through transistor pair 214 diminishes. When this happens, the common source voltage of main input pair 202 decreases, and the current through main input pair 202 decreases. To counter this problem, a replica differential pair 122 is used, as shown and described with reference to FIGS. 1 and 3. FIG. 3 illustrates squeezable tail current source 103, which is the squeezable tail current source 103 of differential operational amplifier 100 of FIG. 1 that corresponds to main input pair 102.

As seen in FIG. 1, the input (vip', vin) of replica pair 122 is tied to the same node as the input (vip', vin) of the main input pair 102, forming a duplicate of main input pair 102. As the input signal (vip', vin) is decreased, the common source voltage of replica pair 122 is decreased, just as it is for main input pair 102. In order to maintain a constant current flowing through bias transistor 118, the gate voltage (Vgs) of bias transistor 118 must increase. With the configuration shown in FIGS. 1 and 3, when the input (vip', vin) is decreased, the current through bias transistor 118 is squeezed along with the current through transistor pair 114. In this way, a self-adjusting loop is formed by the connection of the gate of bias transistor 118 to the drains of replica pair 122. This loop adjusts the gate voltage (Vgs) of bias transistor 118 such that the gate voltage (Vgs) is increased as input (vip', vin) is decreased. In other words, when input (vip', vin) decreases, the drain voltage (Vds) of replica pair 122 increases, which in turn increases the gate voltage (Vgs) of bias transistor 118. This causes the current through replica pair 122 to remain nearly constant, and therefore the mirror tail current into the main input pair 102 remains nearly constant as well, not changing dramatically when the input (vip', vin) swings up and down.

A problem with tail current source 103, however, is that the drain voltages (Vds) of main input pair 102 and replica pair 122 are different for most of the input signal. As can be seen in FIGS. 1 and 3, the drain of replica pair 122 is tied to the gate of transistor pair 114, but the drain of main input pair 102 is not. Because of this difference, if the input (vip', vin) is squeezed, the bias transistor 118 and transistor pair 114 will not have a common drain bias. The drain voltage of bias transistor 118 is different than the drain voltage of transistor pair 114 in this instance. Sub-micron devices have significant channel modulation effects. Differences in the drain voltage of the tail current source result in current variations (i.e., non-linear current) into main input pair 102 as the input signal (vip', vin) changes, resulting in distortions. In other words, the drain voltage (Vds) of replica pair 122 is fixed by the gate voltage (Vgs) of bias transistor 118.

Therefore, differential pairs 102 and 122 operate at different operating points, which causes non-linearity of the tail current entering main input pair 102, resulting in distortion in the output (vop, von).

The distortion problem is more severe when the input signal (vip', vin) is high. For a high input signal, replica pair 122 can enter triode region when the gate voltage is higher than its drain voltage by a threshold voltage. As main input pair 102 operates in the saturation region, the drain voltage of bias transistor 118 and the drain voltage of transistor pair 114 are so different that good linearity (e.g., in the 100 dB range) is not achievable.

Figure 5:
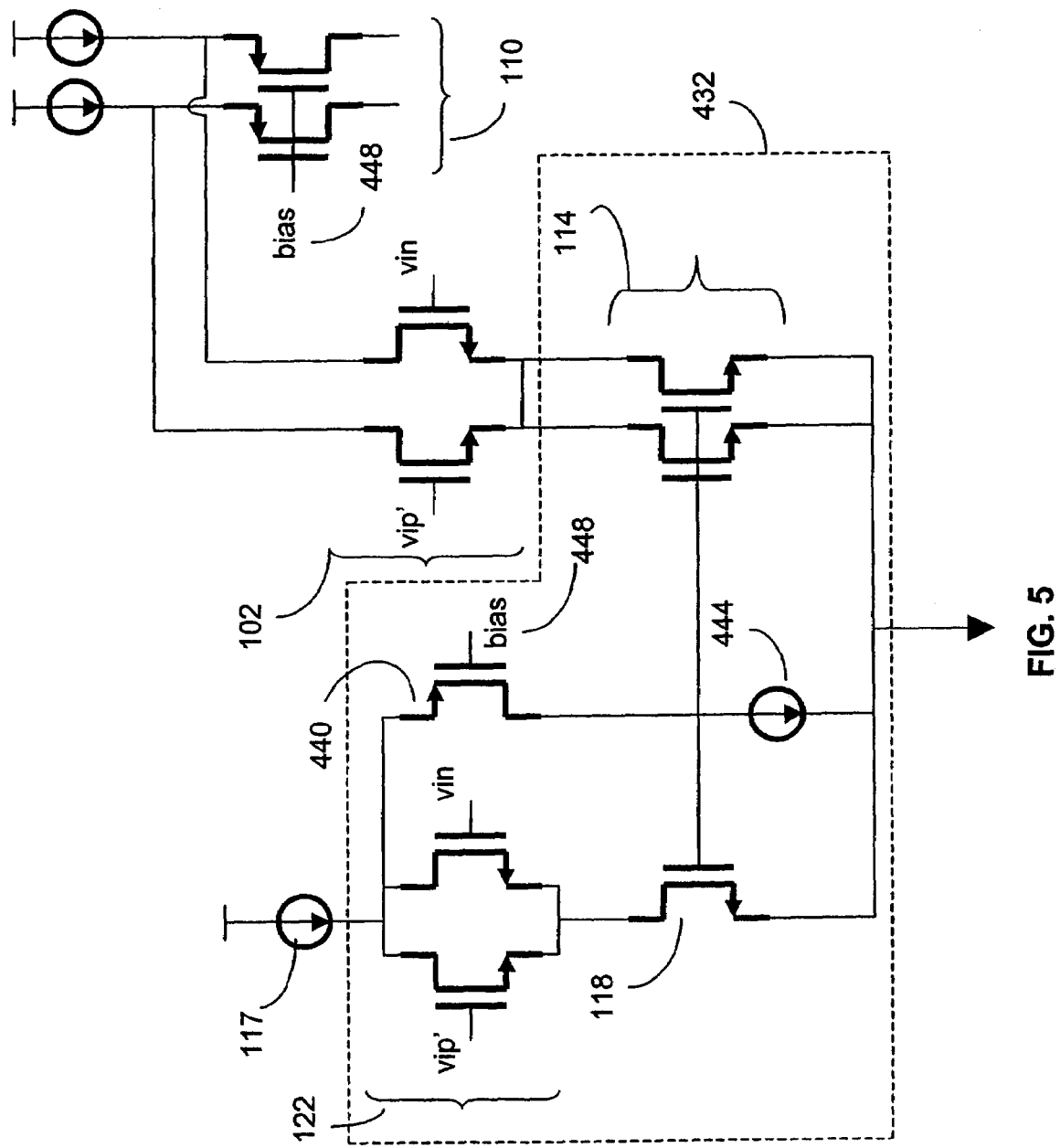
FIG. 5 illustrates a portion of the operational amplifier of FIG. 4, highlighting the tail current source that provides high linearity, according to an embodiment of the present invention.

In order to rectify problems with the tail current source 103 described above, the feedback loop created from replica pair 122 and bias transistor 118 in FIG. 3 is modified into a single-ended self-biased folded feedback loop, as shown in both FIGS. 4 and 5.

FIG. 4 illustrates a differential operational amplifier 400 that includes squeezable tail current sources 432, 434 that allow high linearity, according to an embodiment of the present invention. The portions of differential amplifier 400 represented by box 432 (encompassing transistors 114, 118, 122, and 440) and by box 434 (encompassing transistors 116, 120, 124, and 442) are the squeezable tail current sources. As can be seen in FIG. 4, main input pair 102 is coupled to squeezable tail current source 432 and main input pair 104 is coupled to squeezable tail current source 434. The squeezable tail current sources 432, 434 presented in FIG. 4 are described in detail below. Although differential amplifier 400 includes more than one squeezable tail current source, only one squeezable tail current source (432) is described for simplicity of the description. Both squeezable tail current sources 432, 434 of differential amplifier 400 operate in a similar manner, as will be understood by those skilled in the art.

FIG. 5 illustrates, according to an embodiment of the present invention, a single squeezable tail current source 432 as used with main input pair 102 of FIG. 400. In comparison, squeezable tail current source 432 is similar to squeezable tail current source 103, but also includes a PMOS transistor 440 and a current source 444. PMOS transistor 440 is a folding transistor that is biased by current source 444. The feedback from the drain of replica pair 122 enters the source of folding transistor 440 rather than the gate of bias transistor 118. In this way, bias transistor 118 and transistor pair 114 are isolated from the drain voltage of replica pair 122 by folding transistor 440 and current source 444. As can be seen in FIGS. 4 and 5, folding transistor 440 is biased at the same voltage as transistor pair 110 of amplifier 400. As a result, replica pair 122 and main input pair 102 operate in substantially the same manner, with a common drain bias. Even with a large input (vip', vin), bias transistor 118 and transistor pair 114 also operate in the same bias condition (i.e., they have a common drain bias). With this arrangement, the current is duplicated and is not distorted by the input. Because no tail current distortion is generated, high linearity is readily achieved. The preferred linearity necessary for an ADSL system is 90 dB or higher, with a preferred range of 90 dB–120 dB. Those skilled in the art will appreciate that the replica input branch is scaled independently to meet different bandwidth requirements for settling.

The squeezable tail current source 103 of the present invention is shown in FIGS. 4 and 5 as an NMOS current source with PMOS folding transistor 440 and NMOS input pair 102. Alternatively, a squeezable tail current source according to the present invention is possible as a complimentary PMOS current source with an NMOS folding transistor and a PMOS input pair (not shown).

One advantage of the described invention is that although folding transistor 440 was added, there is still only a single-pole feedback loop. Therefore, there is no compensation issue and no compensation capacitor is needed for stability.

Figure 6:
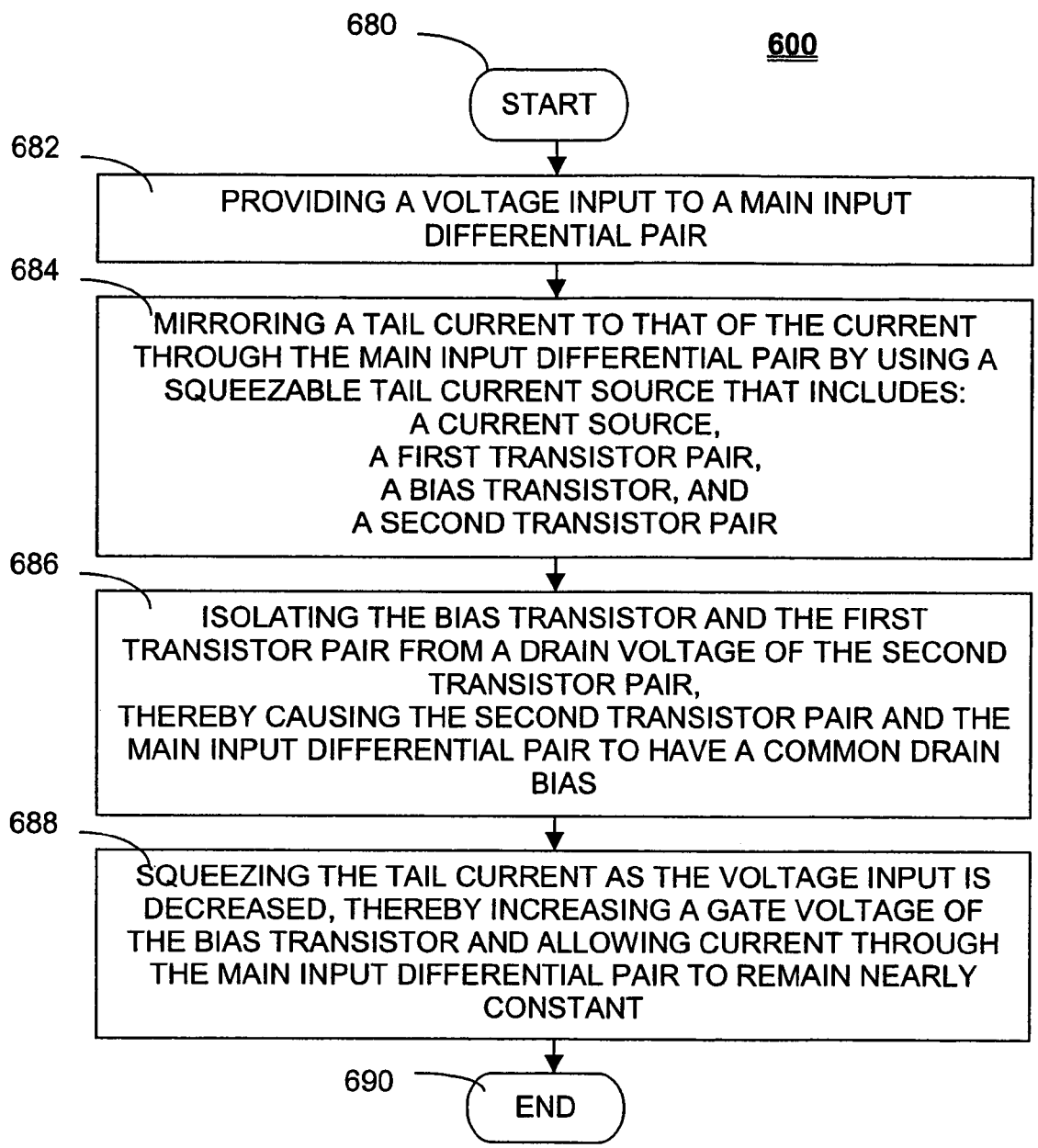
FIG. 6 depicts a method of regulating current through a main input differential pair while maintaining high linearity, according to an embodiment of the present invention.

A method, according to an embodiment of the present invention, of regulating current through a main input differential pair while maintaining high linearity is described in reference to FIG. 6. Method 600 begins at step 680 and immediately proceeds to step 682. In step 682, a voltage input is provided to a main input differential pair. For example, in FIG. 5, the voltage input is depicted as vip' and vin at the gates of main input pair 102. In step 684, a tail current is mirrored to that of the current through the main input differential pair 102 by using a squeezable tail current source as depicted in FIG. 5. The squeezable tail current source of FIG. 5 includes a current source (117), a first transistor pair (transistor pair 114), a bias transistor 118, and a second transistor pair (replica pair 122) that are used to mirror the current. In step 686, the bias transistor (118) and the first transistor pair (transistor pair 114) are isolated from a drain voltage of the second transistor pair (replica pair 122), thereby causing the second transistor pair (replica pair 122) and the main input pair 102 to have a common drain bias. In step 688, the tail current is squeezed as the voltage input (vip', vin) is decreased, thereby increasing a gate voltage of the bias transistor 118 and allowing current through the main input differential pair 102 to remain nearly constant. The method ends at step 690.

The invention described herein mainly addresses problems that occur when there is a low supply and a large swing. Linearity is not a problem when the supplied voltage is high. For example, if the supply is 5 volts, and there is only a 1-volt swing, linearity is not a problem because the swing is relatively small compared to the 5-volt supply, and a squeezable tail current is not needed. A tail current source like the one shown in FIG. 2 is adequate in this example since transistor pair 214 does not enter the linear region. However, if the supply is 2.5 volts, and there is a 1-volt swing, linearity is a problem because the swing is relatively large compared to the 2.5-volt supply, which results in limited headroom for the tail current source to remain in the saturation region. One advantage of the described invention is that its operation is substantially independent of the input level. Whether the input is low or high, the tail current entering main input pair 102 remains nearly constant and no distortion is introduced. In addition, a large swing is representative of a large signal. If this signal can be enhanced with high linearity maintained, the better the signal-to-noise-distortion ratio (SNDR). As SNDR is increased, the faster the data rate that can be achieved.

CONCLUSION

This disclosure presents a fully differential input buffer with a wide signal swing range that allows for high linearity performance. While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An input buffer, comprising:
    a main input transistor pair that receives a voltage input;
    a tail current source; and
    a squeezable tail current source circuit coupled to the main input transistor pair and to the tail current source, the squeezable tail current source circuit including a single-ended self-biased folded feedback loop,
    wherein the main input transistor pair, the tail current source, and the squeezable tail current source circuit are configured such that current through the main input transistor pair is maintained as the voltage input varies.

2. The input buffer of claim 1, wherein the folded feedback loop comprises:
    a folding transistor; and
    a biasing current source that biases the folding transistor.

3. The input buffer of claim 2, wherein the squeezable tail current source circuit further includes:
    a replica transistor pair coupled to the tail current source and the folding transistor that replicates the main input transistor pair and receives the voltage input;
    a bias transistor coupled to the replica transistor pair, the folding transistor, and the biasing current source; and
    a tail transistor pair coupled to the bias transistor, the folding transistor, and the biasing current source,
    wherein the biasing current source and the folding transistor isolate the bias transistor and the tail transistor pair from a drain voltage of the replica transistor pair.

4. The input buffer of claim 3, wherein current through the tail transistor pair and the bias transistor is squeezed as the voltage input to the main input transistor pair is decreased, thereby increasing a gate voltage of the bias transistor, and thereby causing current through both the replica transistor pair and the main input transistor pair to remain nearly constant.

5. The input buffer of claim 3, wherein an input to the replica transistor pair is scaled independently to meet different bandwidth requirements for settling.

6. The input buffer of claim 3, wherein the main input transistor pair, the replica transistor pair, the tail transistor pair, and the bias transistor are NMOS transistors.

7. The input buffer of claim 2, wherein the folding transistor is a PMOS transistor.

8. A differential input buffer, comprising:
    a first main input transistor pair that receives a first voltage input;
    a second main input transistor pair that receives a second voltage input;
    a first tail current source;
    a second tail current source;
    a first squeezable tail current source circuit coupled to the first main input transistor pair and to the first tail current source, the first squeezable tail current source circuit including a first single-ended self-biased folded feedback loop; and
    a second squeezable tail current source circuit coupled to the second main input transistor pair and to the second tail current source, the second squeezable tail current source circuit including a second single-ended self-biased folded feedback loop,
    wherein the first main input transistor pair, the first tail current source, and the first squeezable tail current source circuit are configured such that current through the first main input transistor pair is maintained as the first voltage input varies; and wherein the second main input transistor pair, the second tail current source, and the second squeezable tail current source circuit are configured such that current through the second main input transistor pair is maintained as the second voltage input varies.

9. The differential input buffer of claim 8, wherein the first folded feedback loop comprises:
   a first folding transistor; and
   a first biasing current source that biases the first folding transistor.

10. The differential input buffer of claim 9, wherein the first squeezable tail current source circuit further includes:
   a replica transistor pair coupled to the first tail current source and the first folding transistor that replicates the first main input transistor pair and receives the first voltage input;
   a bias transistor coupled to the replica transistor pair, the first folding transistor, and the first biasing current source; and
   a tail transistor pair coupled to the bias transistor, the first folding transistor, and the first biasing current source,
   wherein the first biasing current source and the first folding transistor isolate the bias transistor and the tail transistor pair from a drain voltage of the replica transistor pair.

11. The differential input buffer of claim 10, wherein current through the tail transistor pair and the bias transistor is squeezed as the first voltage input to the first main input transistor pair is decreased, thereby increasing a gate voltage of the bias transistor, and thereby causing current through both the replica transistor pair and the first main input transistor pair to remain nearly constant.

12. The differential input buffer of claim 10, wherein the first main input transistor pair, the replica transistor pair, the tail transistor pair, and the bias transistor are NMOS transistors.

13. The differential input buffer of claim 9, wherein the first folding transistor is a PMOS transistor.

14. The differential input buffer of claim 8, wherein the second folded feedback loop comprises:
   a second folding transistor; and
   a second biasing current source that biases the second folding transistor.

15. The differential input buffer of claim 14, wherein the second squeezable tail current source circuit further includes:
   a replica transistor pair coupled to the second tail current source and the second folding transistor that replicates the second main input transistor pair and receives the second voltage input;
   a bias transistor coupled to the replica transistor pair, the second folding transistor, and the second biasing current source; and
   a tail transistor pair coupled to the bias transistor, the second folding transistor, and the second biasing current source,
   wherein the second biasing current source and the second folding transistor isolate the bias transistor and the tail transistor pair from a drain voltage of the replica transistor pair.

16. Thedifferential input buffer of claim 15, wherein current through the tail transistor pair and the bias transistor is squeezed as the second voltage input to the second main input transistor pair is decreased, thereby increasing a gate voltage of the bias transistor, and thereby causing current through both the replica transistor pair and the second main input transistor pair to remain nearly constant.

17. The differential input buffer of claim 15, wherein the second main input transistor pair, the replica transistor pair, the tail transistor pair, and the bias transistor are NMOS transistors.

18. The differential input buffer of claim 14, wherein the second folding transistor is a PMOS transistor.

19. The differential input buffer of claim 8, further comprising:
   a first stage having an input coupled to the first and second main input transistor pairs and having an output;
   a second stage having an input coupled to the first stage output and having an output; and
   an output coupled to the second stage output.

20. A method of maintaining a constant current through a main input transistor pair of a differential amplifier while maintaining high linearity, the method comprising:
   providing a voltage input to the main input transistor pair;
   mirroring a tail current to that of the current through the main input transistor pair by using a squeezable tail current source configured to isolate a bias transistor and a first transistor pair of the squeezable tail current source from a drain voltage of a second transistor pair of the squeezable tail current source, thereby causing the second transistor pair and the main input transistor pair to have a common drain bias; and
   squeezing the tail current as the voltage input is decreased, thereby increasing a gate voltage of the bias transistor and allowing current through the main input transistor pair to remain nearly constant.

* * * * *